United States Patent [19]

Miller

[11] Patent Number: 4,459,547

[45] Date of Patent: Jul. 10, 1984

[54] METHOD AND APPARATUS FOR PRECISE MEASUREMENT OF LONG-TERM STABILITY OF PHOTODETECTORS

[75] Inventor: Stephen A. Miller, Upland, Calif.

[73] Assignee: The United States of America as represented by the Secretary of the Navy, Washington, D.C.

[21] Appl. No.: 259,786

[22] Filed: May 1, 1981

[51] Int. Cl.³ ............................................. G01R 31/26
[52] U.S. Cl. .............................. 324/158 R; 324/158 D
[58] Field of Search ........................ 324/158 R, 158 D; 250/227

[56] References Cited

U.S. PATENT DOCUMENTS

| | | | |
|---|---|---|---|
| 3,749,924 | 7/1973 | Vischulis | 250/227 |
| 3,781,092 | 12/1973 | Sussman et al. | 350/266 |
| 4,122,383 | 10/1978 | Frosch et al. | 324/158 D |
| 4,129,823 | 12/1978 | van der Pool et al. | 324/158 D |
| 4,147,979 | 4/1979 | Baues et al. | 324/244 |
| 4,163,194 | 7/1979 | Ross | 324/158 D |

Primary Examiner—Ernest F. Karlsen
Attorney, Agent, or Firm—Robert F. Beers; Ervin F. Johnston; Harvey Fendelman

[57] ABSTRACT

A method and apparatus is disclosed for the measurement of the long-term stability of photodetectors. A fiber optic star coupler divides optical flux from a source of light into highly stable proportioned light outputs. Each of the photodetectors to be tested is connected to be irradiated by one of the star coupler light outputs. Each of at least one reference photodetectors having known stabilities is connected to one of the remaining outputs of the star coupler. Resulting outputs of the photodetectors to be tested are compared against the resulting output from the reference photodetector.

13 Claims, 1 Drawing Figure

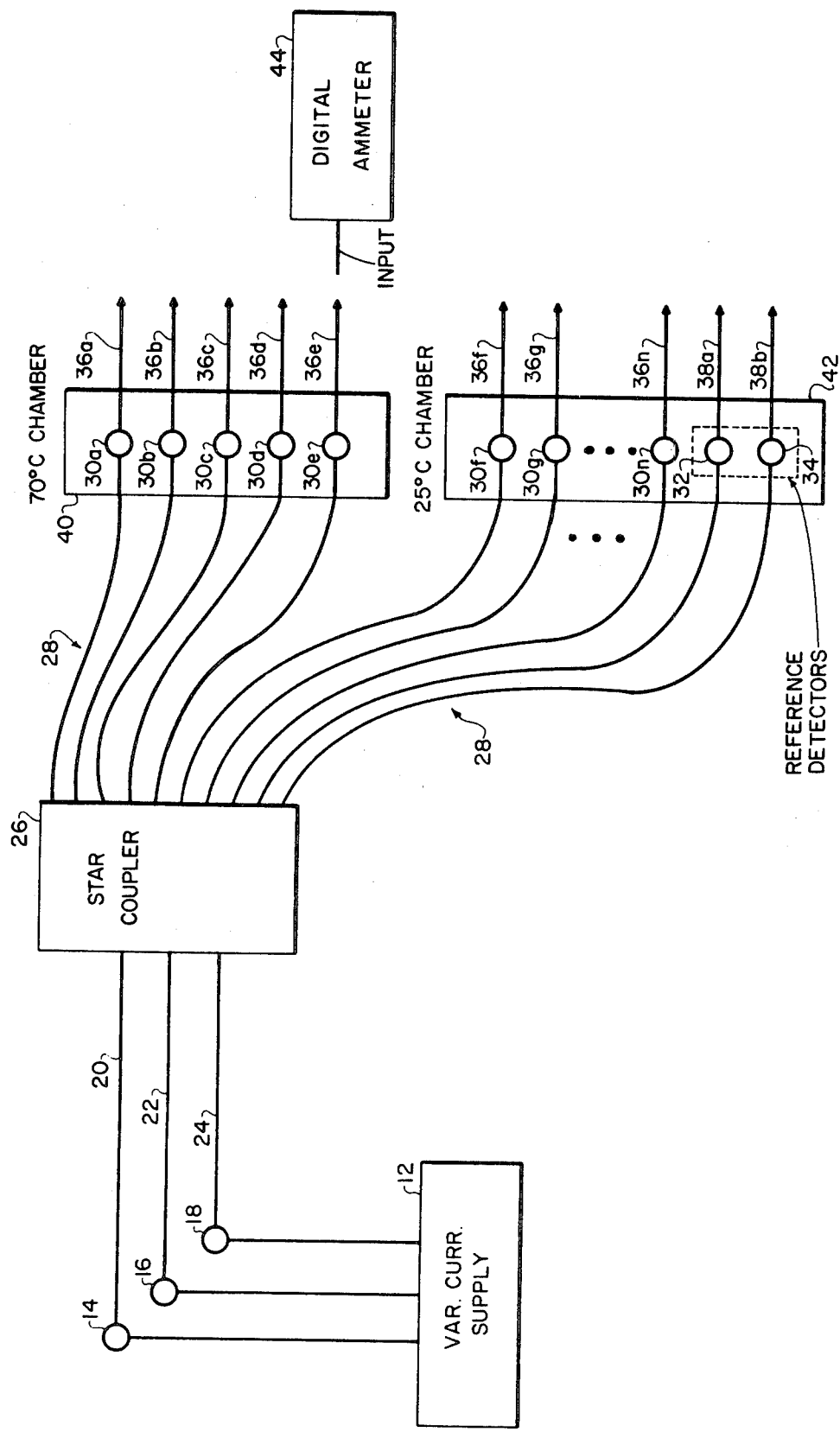

METHOD AND APPARATUS FOR PRECISE MEASUREMENT OF LONG-TERM STABILITY OF PHOTODETECTORS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of optics and more specifically to the field of measurement and testing of the stability of photodetectors.

The determination of the long-term stability of a photodetector requires the measurement of the response, e. g. photocurrent, of the photodetector to a known or constant optical flux. The usual procedure for assuring that the measurement flux is constant is physically to substitute a reference detector, known to be stable, for the detector under test and to use the response of the reference detector to set the optical flux level. The problem with this method is that it is impossible mechanically to reproduce the positions of the photodetectors in the optical flux to a high precision, especially if a number of test detectors are to be monitored concurrently. Practically, with this foregoing method measurement precision on the order of 1% is not possible.

SUMMARY OF THE INVENTION

The present invention overcomes the problems of the prior art by providing a method and system capable of the precise and reproducible calibration of photodetectors. This is accomplished by utilization of a mechanism for dividing the output of a source of optical flux into a plurality of constant proportion optical flux outputs. The proportional division may be such that all ouptuts are equal or some other proportion between the outputs may be used. Each of these optical flux outputs is utilized to irradiate a separate photodetector to be tested for stability and also to irradiate one of the reference photodetectors having known stability. The resulting photocurrent or other response characteristic of each of the photodetectors to be tested is compared against the resulting photocurrent, or other response characteristic, of the stable reference photodetector. By utilization of the apparatus and technique of the present invention the measurement of the long-term stability of photodetectors to a precision of 1% or better may be achieved. This degree of precision was formerly practically impossible where many more than one detector were being tested.

OBJECTS OF THE INVENTION

Accordingly, it is the primary object of the present invention to disclose a novel technique for the precise measurement of the stability of photodetectors.

It is a concomitant object of the present invention to disclose an apparatus for the precise measurement of the long-term stability of photodetectors.

Other objects and many of the attendant advantages of this invention will be readily appreciated as the same becomes better understood by reference to the following detailed description when considered in connection with the accompanying drawings.

BRIEF DESCRIPTION OF THE DRAWINGS

The sole FIGURE is a schematic block diagram of the apparatus and technique of the present invention.

DESCRIPTION OF THE PREFERRED EMBODIMENT

Referring to the drawing, the apparatus and method of the present invention will now be described. In accordance with the present invention a variable current supply 12 supplies power to a source of light comprised of light emitting diodes 14, 16 and 18. The variable current supply 12 and the light emitting diodes 14, 16 and 18 thus comprise a variable source of optical flux. It is to be understood at this point that other forms of variable sources of optical flux may be utilized in the present invention. For instance, fewer or greater than three light emitting diodes may be utilized or a completely different source of optical flux may be utilized within the scope of the present invention. The plurality of light emitting diodes may be operated singly or in combination.

Fiber optic links 20, 22 and 24 connect the outputs of the light emitting diodes 14, 16 and 18, respectively to a star coupler 26. The output of the star coupler 26 is connected via fiber optic links 28 to the photodetectors 30a, 30b, ..., 30n. The photodetectors 30a, 30b, ..., 30n are the photodetectors to be tested for long-term stability. Also connected to outputs of the star coupler 26 via fiber optic links 28 are reference photodetectors 32 and 34. It is noted at this point, that although two redundant stable reference photodetectors 32 and 34 are illustrated, the technique of the present invention may be accomplished by use of one reference photodetector or more than two reference photodetectors for greater redundancy. Each of the photodetectors 30a, 30b, ..., 30n has an output lead 36a, 36b, 36c, 36d, ..., 36n and, likewise each of reference photodetectors 32 and 34 has an output lead 38a and 38b.

By way of example of a particular utilization of present invention, the photodetectors 30a, 30b, 30c, 30d and 30e are illustrated as being enclosed within a precise temperature oven 40 illustrated in the present example as a 70° C. chamber. A second oven 42 is provided for containing the reference photodetectors 32 and 34 as well as the photodetectors 30f, 30g, ..., 30n to be tested. Preferably, the oven 42 is maintained at room temperature, approximately 25° C. in order to ensure the stability of the reference photodetectors 32 and 34. Finally, a digital ammeter 44 is provided for selective connection to each of the output leads of the reference and test photodetectors.

In operation, the light flux from the light sources 14, 16 and 18 is divided in constant proportion among the outputs of the star coupler 26. Each of the fiber optic links 28 therefore carries a constant proportion of the light flux for irradiating each of the test photodetectors 30a, ..., 30n as well as each of the reference photodetectors 32 and 34. Although the star coupler 26 is illustrated as a single star coupler, it is to be understood that cascaded star couplers may be utilized as well in order to increase the number of outputs available. The star coupler 26 has the property that the optical flux incident at any input port is divided in an extremely stable ratio among all the output ports. Because the division ratio of the star coupler 26 is constant, it is possible to reset the flux on all photodetectors 30, 32 and 34 extremely precisely by adjusting the source flux level via variable current supply 12 to produce a constant response from the reference detectors 32 and 34. In this way, as long as the mechanical arrangement of the test device of the present invention is unaltered, any change in response from the detectors 30 under test can be ascribed to real changes in their characteristics over the duration of the test.

Obviously, many other modifications and variations of the present invention are possible in the light of the above teachings. It is therefore to be understood that within the scope of the appended claims the invention may be practiced otherwise than as specifically described.

What is claimed is:

1. A device for testing the stability of M photodetectors by comparing a response characteristic of said M photodetectors to the same response characteristic of at least one reference photodetector comprising:
   a source of optical flux;
   means for receiving the optical flux from said source and for dividing said optical flux into N constant proportion optical flux outputs;
   M photodetectors to be tested, each connected to one of said N outputs, where M<N and M and N are integers; and
   at least one reference photodetector having known stability, each being connected to one of said N outputs;
   whereby upon irradiation of each of said M photodetectors to be tested and upon irradiation of each of said at least one reference photodetectors by one of said N constant proportion optical flux outputs, said response characteristic of said M photodetectors to be tested can be compared to said response characteristic of said at least one reference photodetector.

2. The device of claim 1 wherein each of said reference photodetectors is mounted within a first controlled temperature oven.

3. The device of claim 2 wherein each of said reference photodetectors is mounted within a second controlled temperature oven.

4. The device of claims 1, 2 or 3 wherein said receiving means comprises a star coupler.

5. The device of claim 4 wherein said source of optical flux comprises at least one light emitting diode.

6. The device of claim 5 further comprising:
   a variable current supply connected to said at least one light emitting diode.

7. The device of claim 6 further comprising:
   means for measuring an output characteristic of each of said M photodetectors to be tested and each of said at least one reference photodetectors.

8. The device of claim 7 wherein said star coupler is connected to said source of optical flux by a first fiber optic link.

9. The device of claim 8 wherein said star coupler is connected to each of said M photodetectors and to each of said reference photodetectors by a second fiber optic link.

10. The device of claim 4 wherein M is at least three.

11. The device of claim 7 wherein said measuring means comprises a current meter.

12. A method of testing the stability of photodetectors comprising:
   generating a set of N constant proportion optical flux outputs;
   irradiating each of M photodetectors to be tested with one of said N outputs where M<N;
   irradiating at least one reference photodetector with one of said N outputs;
   comparing the output of each of said M photodetectors with the outputs of said reference photodetectors.

13. The method of claim 12 wherein N is at least four.

* * * * *